(12) United States Patent
Lin et al.

(10) Patent No.: US 6,495,893 B2
(45) Date of Patent: Dec. 17, 2002

(54) MICRO-MECHANICAL ACTUATOR INCLUDING AUXILIARY LEVER TO ENLARGE TRAVEL RANGE OF ACTUATED OBJECT

(76) Inventors: Hung-Yi Lin, No. 11, Ally 23, Lane 294, Sec. 4, Chenggung Rd., Taipei (TW); Weileun Fang, 4th Fl., No. 301, Sec. 2, Guangfu Rd., Hsinchu (TW)

(*) Notice: Subject to any disclaimer, the term of this patent is extended or adjusted under 35 U.S.C. 154(b) by 0 days.

(21) Appl. No.: 09/843,913

(22) Filed: Apr. 27, 2001

(65) Prior Publication Data

US 2002/0084499 A1 Jul. 4, 2002

(30) Foreign Application Priority Data

Feb. 1, 2001 (TW) .......................................... 90102092

(51) Int. Cl.[7] .............................................. H01L 29/82
(52) U.S. Cl. ...................... 257/415; 257/420; 257/421; 257/467; 200/181; 310/309; 310/323.02; 333/105; 333/262; 359/290; 359/295; 438/52
(58) Field of Search ................................ 257/415, 420, 257/421, 467; 438/52; 310/309, 323.02, 323.16; 200/181; 333/105, 262; 359/295, 290

(56) References Cited

U.S. PATENT DOCUMENTS

| 5,903,380 A | * | 5/1999 | Motamedi et al. ............ 359/224 |
| 5,995,688 A | | 11/1999 | Aksyuk et al. ................ 385/14 |
| 6,307,169 B1 | * | 10/2001 | Sun et al. ..................... 200/181 |

* cited by examiner

*Primary Examiner*—Nathan J. Flynn
*Assistant Examiner*—Remmon R. Fordé
(74) *Attorney, Agent, or Firm*—Madson & Metcalf

(57) ABSTRACT

A micro-mechanical actuator is disclosed for actuating an object in a micro-electro-mechanical system. One end of the object is flexibly connected a substrate, and another end is flexibly connected to an auxiliary lever which is further connected to an actuating force generator. The auxiliary lever receives an actuating force generated from the actuating force generator to perform a levering operation about a fulcrum. The position of the fulcrum allows an portion of the auxiliary lever connected to the object has a shift larger than a shift of another portion of the auxiliary lever connected to the actuating force generator in response to the actuating force.

22 Claims, 17 Drawing Sheets

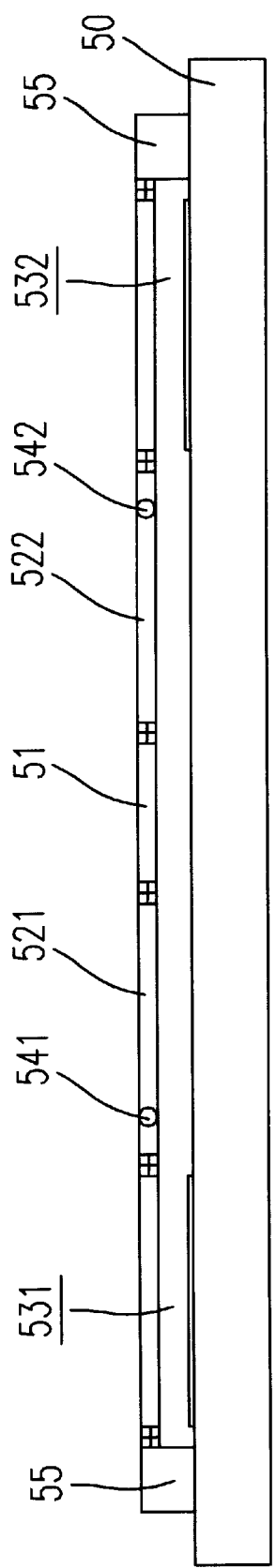
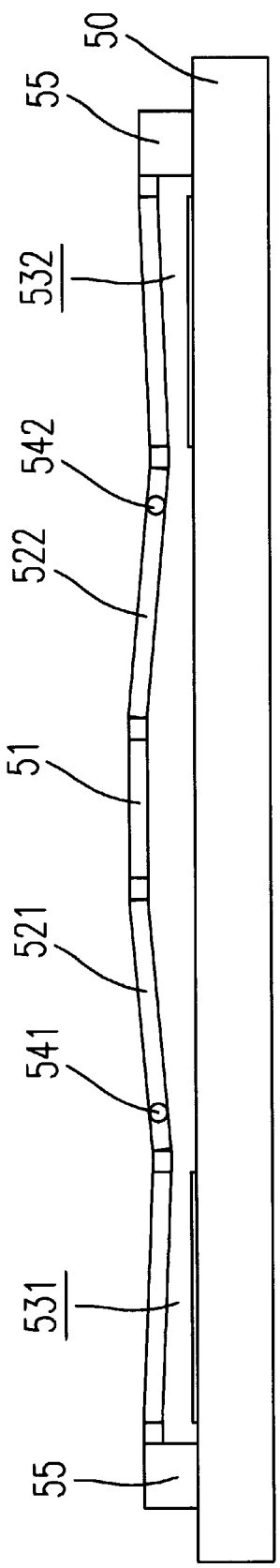

MICRO-MECHANICAL ACTUATOR INCLUDING AUXILIARY LEVER TO ENLARGE TRAVEL RANGE OF ACTUATED OBJECT

FIELD OF THE INVENTION

The present invention relates to a micro-mechanical actuator, and more particularly to a micro-mechanical actuator for moving a micro-element in a micro-electro-mechanical system (MEMS).

BACKGROUND OF THE INVENTION

A micro-electro-mechanical system (MEMS) pertains to a technique analogous to a semiconductor manufacturing process to produce a tiny and actuated mechanical element. A micro-mechanical actuator utilizing an electrostatic force as the actuating power has various applications. A conventional micro-mechanical actuator is schematically shown in FIGS. 1A~1C wherein FIGS. 1B and 1C are cross sectional views taken along the line A–A' of FIG. 1A. In the left portion of the figure, an object 11 supported by anchors 101 is to be actuated to move up and down, and in the right portion, another object 12 supported by anchors 102 is to be actuated to rotate with a shaft 121. For each of the objects 11 and 12, the object itself functions as an electrode which interacts with another electrode 131 or 132 formed on the substrate 14 to control the movement or the rotation of the object 11 or 12, as shown in FIG. 1B. The interaction between the object electrode 11 or 12 and the electrode 131 or 132 is generated due to the electrostatic force therebetween. Owing to the electrostatic attracting force, the top electrode 11 moves toward the bottom electrode 131 as indicated by the arrow B so as to reduce the size of the gap therebetween, as shown in the left portion of FIG. 1C. On the other hand, for the right portion of FIG. 1C, the top electrode 12 moves toward one of the bottom electrodes 132 so as to rotate in a direction indicated by the arrow C.

For the conventional micro-mechanical actuator mentioned as above, the rotation angle is confined within a small range if the gap d is made small. On the contrary, if the gap d is made large, the voltage for actuating the circuit will be required to be large correspondingly so as to load burden on the actuating circuit.

Using a supporting spring device of relatively low elasticity coefficient between each anchor and the object may lower the actuating voltage. The dynamic response of the micro-mechanical actuator, however, will become slow so as to adversely effect the properties of the device.

U.S. patent application No. 5,995,688 discloses a micro-mechanical actuator which enlarges the rotation angle of the object in a single direction without increasing the actuating voltage. Please refer to FIGS. 2A~2C wherein FIGS. 2B and 2C are cross sectional views taken along the line D–D' of FIG. 2A. A micro-mechanical actuator 20 consisting of a top electrode 201 and a bottom electrode 202 is used for actuating an object 21 connected to the top electrode 201. When the top electrode 201 is attracted by the bottom electrode 202 to move downwards, as indicated by an arrow E, the object 21 is levered up, as indicated by the arrow F, because of the presence of a fulcrum 22, as shown in FIG. 2C. Accordingly, the object 21 can be levered up by a relatively large travel. The levering down of the arm 21, however, is still confined by the substrate 24.

SUMMARY OF THE INVENTION

Therefore, an object of the present invention is to provide a micro-mechanical actuator for actuating an object in a micro-electro-mechanical system, which allows a relatively large travel range of the object.

The present invention relates to a micro-mechanical actuator for actuating an object in a micro-electro-mechanical system, which includes a substrate for being flexibly connected thereto the object; a first actuating force generator positioned on the substrate for generating a first actuating force; a first auxiliary lever having opposite first and second portions thereof flexibly connected to the first actuating force generator and a first end of the object, respectively, for performing a first levering operation to transmit the object in response to the first actuating force; and a first fulcrum element connected to the first auxiliary lever for allowing the first auxiliary lever to perform the first levering operation thereabout, and arranged at a first specific position for allowing the second portion of the first auxiliary lever has a first shift larger than a second shift of the first portion of the first auxiliary lever in response to the first actuating force.

In an embodiment, the first actuating force generator includes a bottom electrode secured on the substrate; and a top electrode flexibly connected to the first auxiliary lever and the substrate, and moved downwards by an attracting electrostatic force between the top and bottom electrodes to generate the first actuating force for the first auxiliary lever.

Preferably, the first auxiliary lever includes a bump structure for strengthening the first auxiliary lever.

Preferably, the first fulcrum is secured onto the substrate via an anchor.

The first specific position of the first fulcrum may lie between the first and second portions of the first auxiliary lever. Alternatively, the specific position of the first fulcrum may lie at the same side of the first and second portions.

The substrate may be directly connected thereto a second end of the object. Alternatively, the substrate may be connected thereto a second end of the object via a second actuating force generator and a second auxiliary lever. The second actuating force generator is positioned on the substrate for generating a second actuating force. The second auxiliary lever having opposite third and fourth portions thereof flexibly connected to the second actuating force generator and the second end of the object, respectively, for performing a second levering operation to transmit the object in response to the second actuating force. In this embodiment, the micro-mechanical actuator further includes a second fulcrum element connected to the second auxiliary lever for allowing the second auxiliary lever to perform the second levering operation thereabout, and arranged at a second specific position for allowing the fourth portion of the second auxiliary lever has a third shift larger than a fourth shift of the third portion of the second auxiliary lever in response to the second actuating force.

Preferably, the substrate includes a trench positioned right under the first actuating lever and the object for providing a space at least sufficient for the first and second shifts of the first actuating lever.

For example, the micro-mechanical actuator can be used for actuating an optical switch or a radio-frequency (RF) switch in a micro-electro-mechanical system.

In an embodiment, the first auxiliary lever and the first fulcrum are formed by steps of forming a trench and a mask on the substrate; forming a sacrificial layer over the trench; forming a structure layer on the sacrificial layer and the mask; and defining a pattern on the structure layer, and removing the sacrificial layer.

In an embodiment, the substrate is a silicon substrate. The mask is formed of silicon nitride. The sacrificial layer is formed of silicon dioxide. The structure layer is formed of a material selected from a group consisting of silicon nitride, polysilicon and metal.

Preferably, the first auxiliary lever includes a U-shaped cross section extending toward the trench for strengthening the first auxiliary lever.

Preferably, the trench is further enlarged by etching the substrate. For example, the etching of the substrate is performed by anisotropic wet etching after removing the sacrificial layer, or deep reactive ion etching from a side of the substrate opposite to the sacrificial layer before removing the sacrificial layer.

Preferably, the pattern on the structure layer further includes an anchor on the mask for securing the first fulcrum onto the substrate.

BRIEF DESCRIPTION OF THE DRAWINGS

The present invention may best be understood through the following description with reference to the accompanying drawings, in which:

FIGS. 6B and 6C are cross-sectional views of FIG. 6A wherein there is no electrostatic force applied in FIG. 6B, and there is an electrostatic force applied in FIG. 6C;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1A:
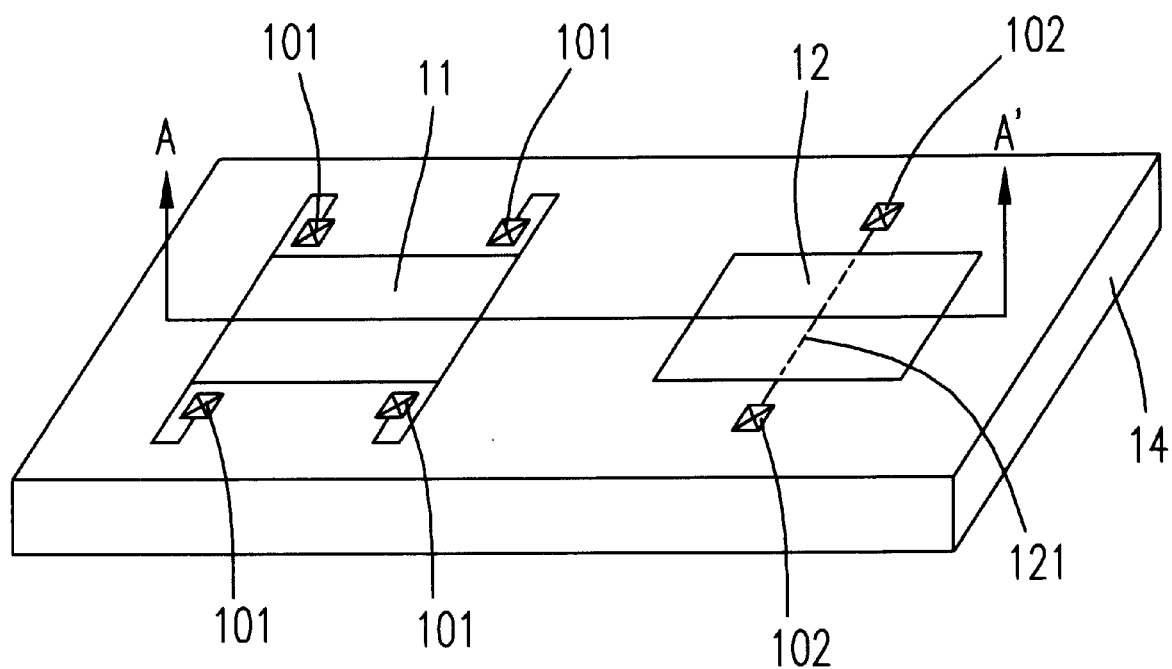
FIG. 1A is a schematic diagram showing two kinds of conventional micro-mechanical actuators.
Figure 1B:
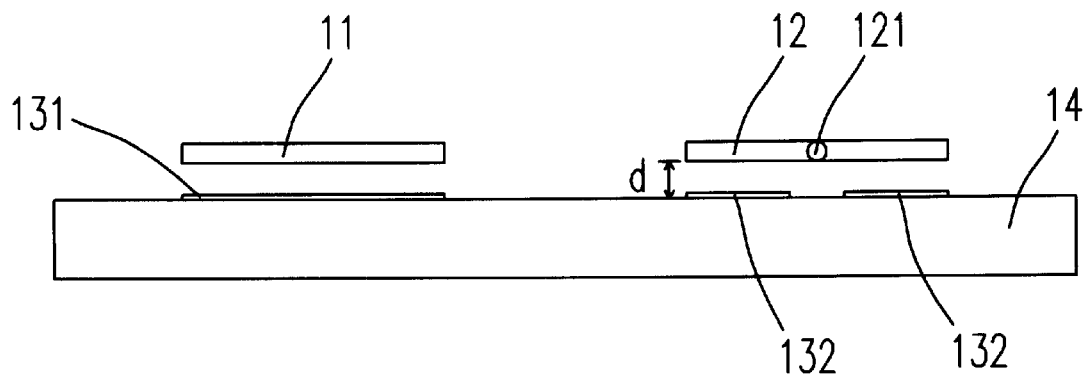
FIGS. 1B and 1C are cross-sectional views of FIG. 1A wherein there is no electrostatic force applied in FIG. 1B, and there is an electrostatic force applied in FIG. 1C.
Figure 1C:
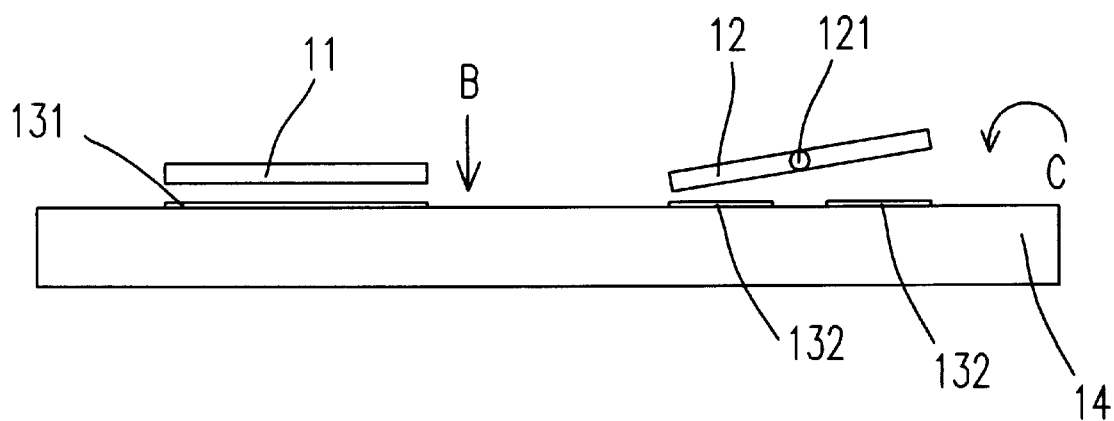
Figure 2A:
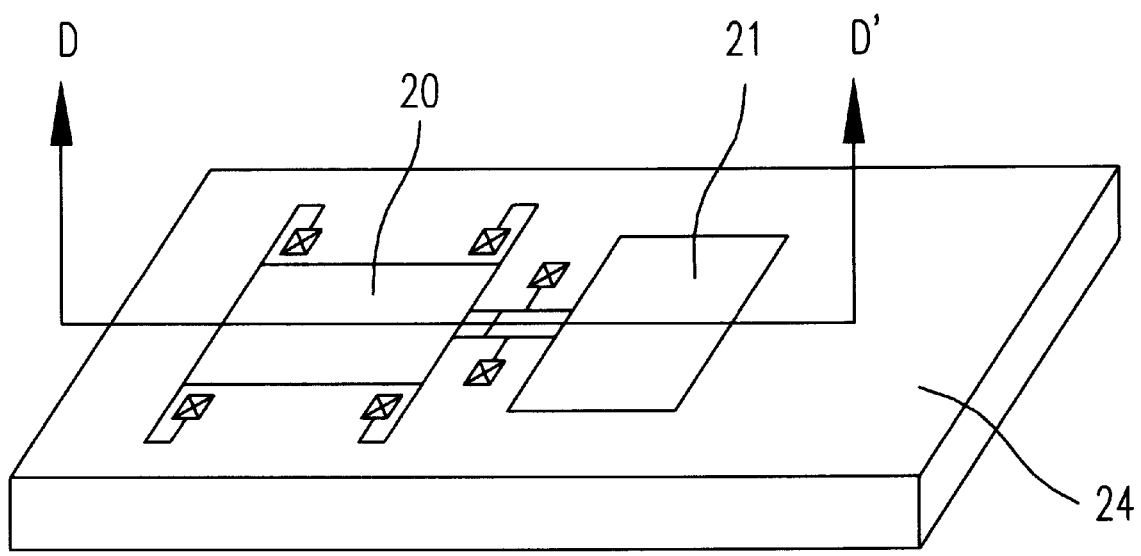
FIG. 2A is a schematic diagram showing another conventional micro-mechanical actuator.
Figure 2B:
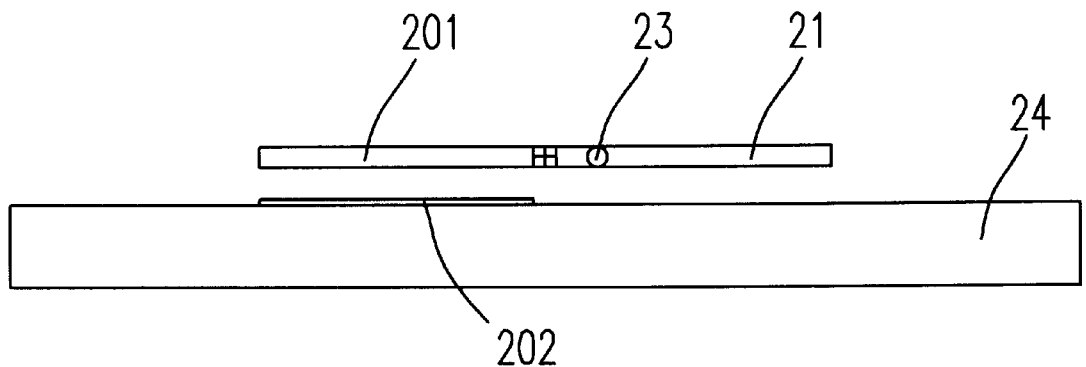
FIGS. 2B and 2C are cross-sectional views of FIG. 2A wherein there is no electrostatic force applied in FIG. 2B, and there is an electrostatic force applied in FIG. 2C.
Figure 2C:
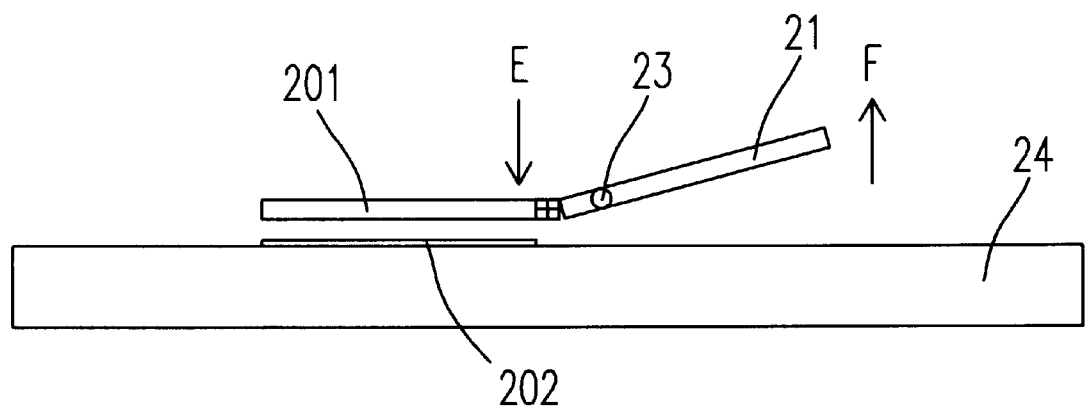
Figure 3A:
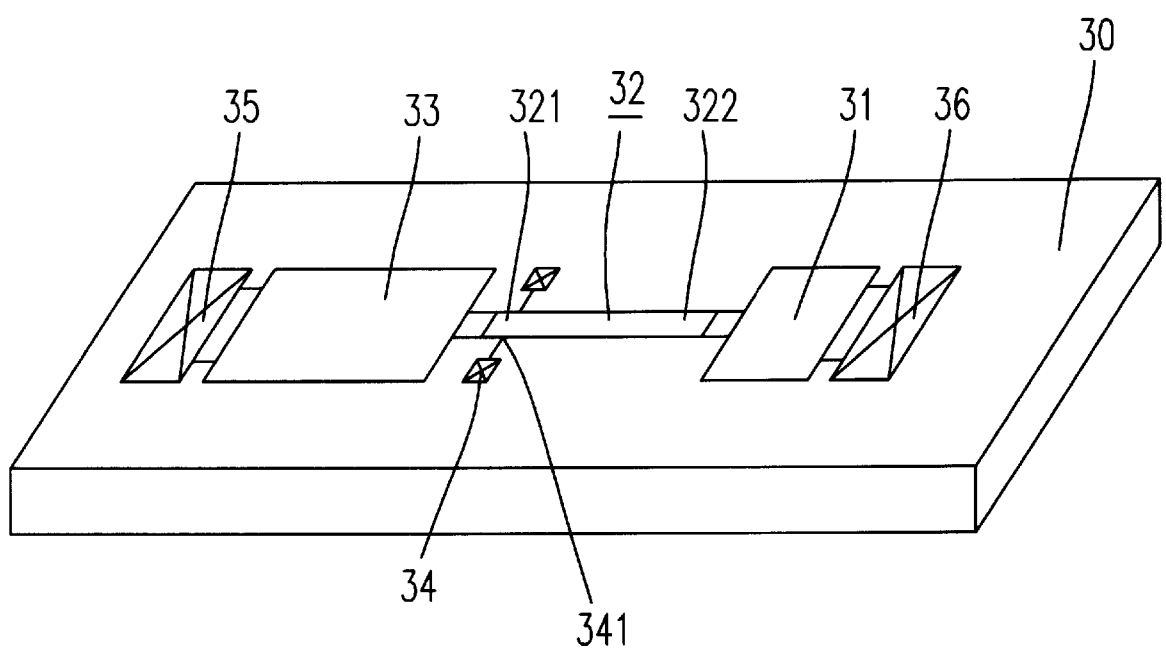
FIG. 3A is a schematic diagram showing a first embodiment of a micro-mechanical actuator according to the present invention.
Figure 3B:
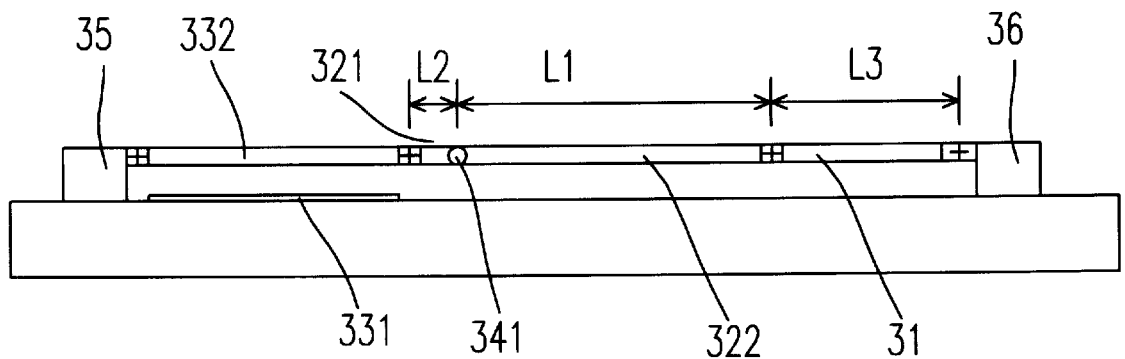
FIGS. 3B and 3C are cross-sectional views of FIG. 3A wherein there is no electrostatic force applied in FIG. 3B, and there is an electrostatic force applied in FIG. 3C.
Figure 3C:
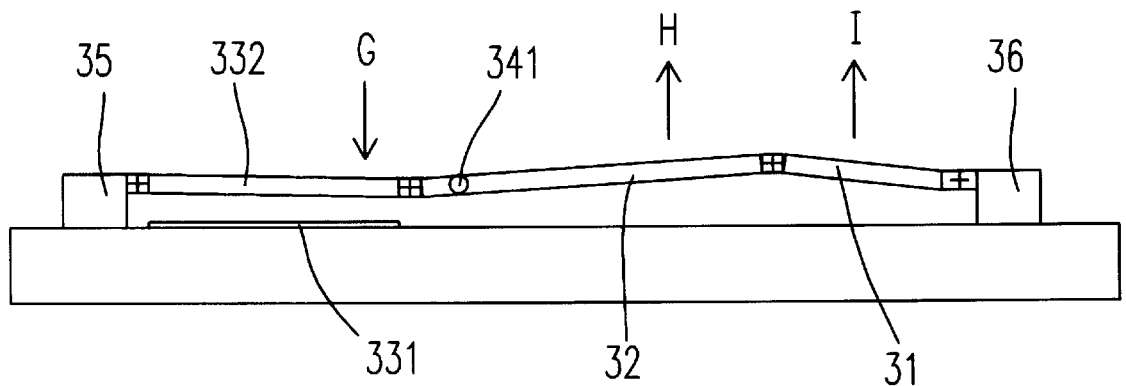

Referring to FIGS. 3A~3C, a first embodiment of a micromechanical actuator according to the present invention includes a substrate 30, an actuating force generator 33, an auxiliary lever 32, anchors 34, 35, 36, and a fulcrum 341. The actuating force generator 33 includes a bottom electrode 331 secured on the substrate 30, and a top electrode 332 having one end thereof flexibly connected to the substrate 30 via the anchor 35, and the opposite end flexibly connected to the auxiliary lever 32 (FIG. 3B). One end of an object 31 is flexibly connected to the substrate 30 via the anchor 36, and the opposite end of the object 31 is flexibly connected to the auxiliary lever 32. The fulcrum 341 is connected to the substrate 30 via anchors 34, and to the auxiliary lever 32 between two opposite ends of the auxiliary lever 32. A first portion 321 of the auxiliary lever 32 between the left end and the fulcrum 341 serves as a force-exerting arm, and a second portion 322 of the auxiliary lever 32 between the fulcrum 341 and the right end serves as a force-receiving arm. The position of the fulcrum 341 makes the length L2 of the force-exerting arm smaller than the length L1 of the force-receiving arm.

It is to be noted that the term "flexibly connected" used herein means that the junction between two elements is flexible, and this purpose can be achieved for example by using a material of a relatively low strain to form the elements, or thinning the junction relative to the thickness of the elements. By flexible connection, the junction will not be broken even when the opposite end of either of the elements does not synchronously move with the junction end. In the drawings, crossmarked blocks are used to indicate flexible junctions.

Figure 3D:
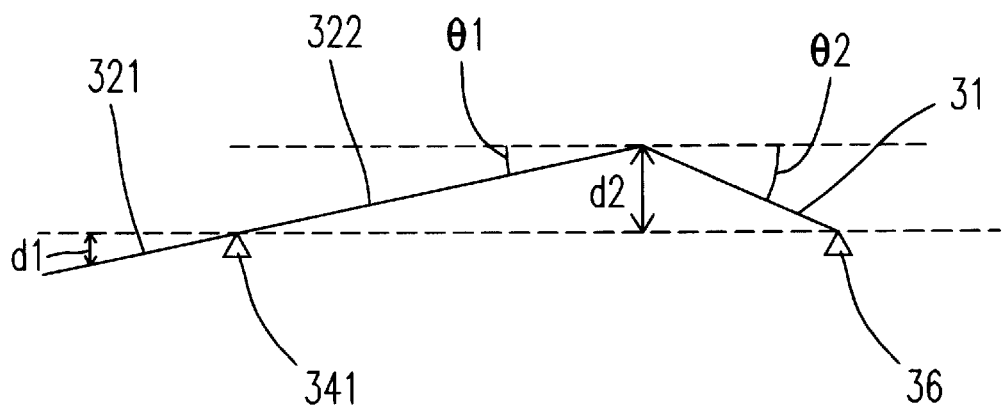
FIG. 3D schematically shows why the presence of the auxiliary lever and fulcrum enlarge the travel range and rotation angle of the object.

When the top electrode 332 is attracted by the bottom electrode 331 to move downwards so as to provide an actuating force to move the first portion 321 of the auxiliary lever 32 downwards, as indicated by the arrow G of FIG. 3C, the second portion 322 of the auxiliary lever 32 will move upwards, as indicated by the arrow H. Accordingly, the end of the object connected to the second portion 322 of the auxiliary lever 32 will also move upwards, as indicated by the arrow I. By properly designing the lengths L1 and L2 of the first and second portions 321 and 322 based on the length L3 of the object 31, the object can have a desirable travel range with relatively small shift of the top electrode 332. For example, referring to FIG. 3D, the length L1 > the length L2, so the shift d1 is less than the shift d2 due to the homologous triangle relationship. Therefore, a relatively small shift d1 of the actuating force generator may lift the object up by a relatively large shift d2. On the other hand, owing to the length L1> the length L3, a relatively small slant angle θ1 of the auxiliary lever results in a relatively large slant angle θ2 of the object 31.

Figure 4A:
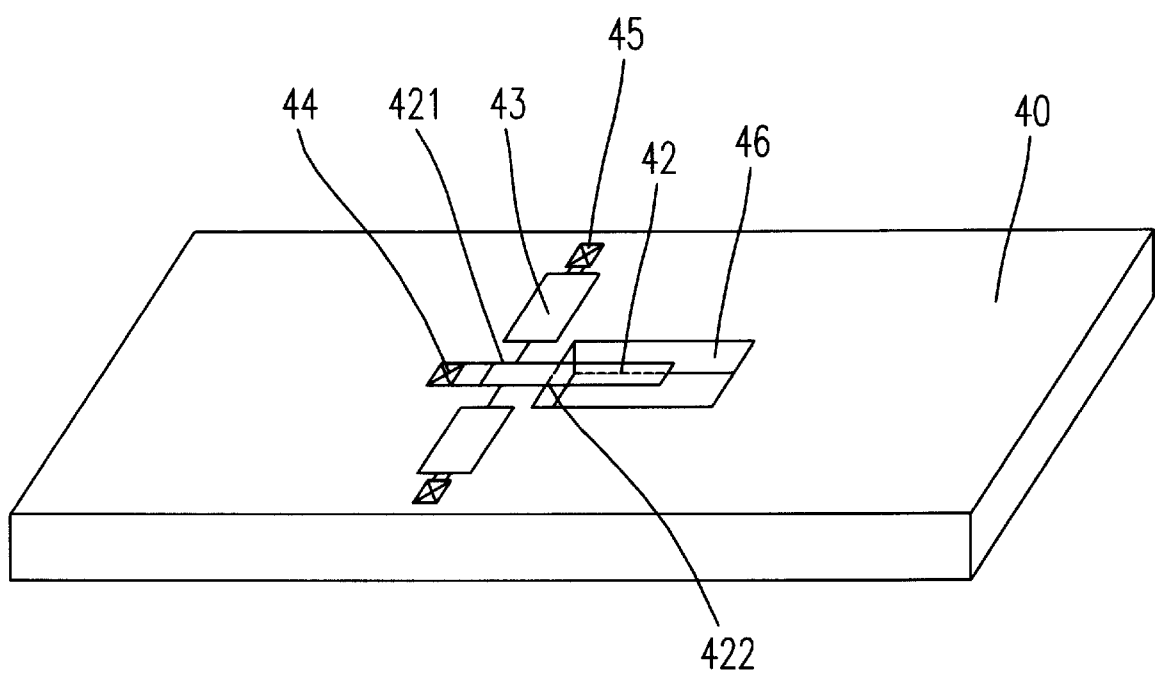
FIG. 4A is a schematic diagram showing a second embodiment of a micro-mechanical actuator according to the present invention.
Figure 4B:
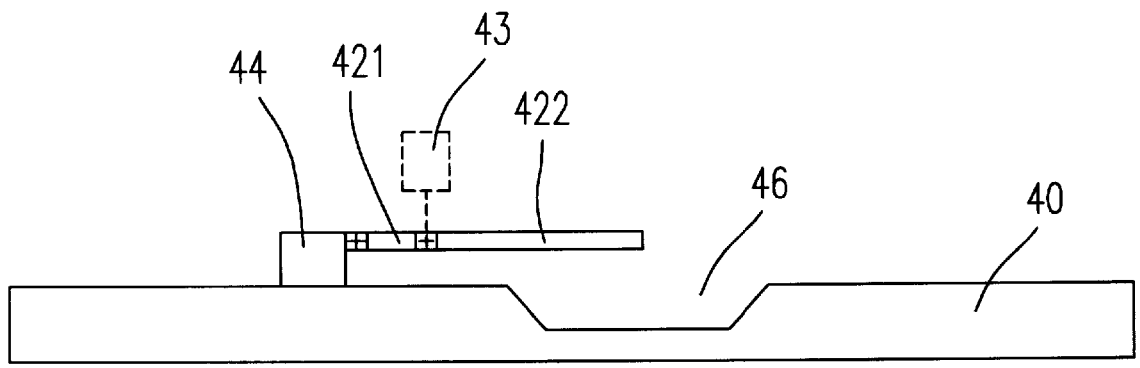
FIGS. 4B and 4C are cross-sectional views of FIG. 4A wherein there is no electrostatic force applied in FIG. 4B, and there is an electrostatic force applied in FIG. 4C.

Please refer to FIGS. 4A~4B which schematically show a second embodiment of a micro-mechanical actuator according to the present invention. The micro-mechanical actuator includes a substrate 40, an actuating force generator 43, an auxiliary lever 42, and anchors 45, which perform similar functions as described above with reference to FIG. 3. The anchor 44 positioned at the left end of the auxiliary lever 42, functions as a fulcrum in this embodiment so that the force-exerting arm 421 and the force-receiving arm 422 are located at the same side of the fulcrum 44. The length of the force-exerting arm 421 is still required to be less than that of the force-receiving arm 422 in order to achieve the purposes mentioned above with reference to FIG. 3D. Moreover, a trench 46 is included in the substrate 40 for providing a larger space for the shift of the actuating lever and the object to be actuated. The object to be actuated is not shown in these figures in order to make the drawings clean and clear.

Figure 4C:
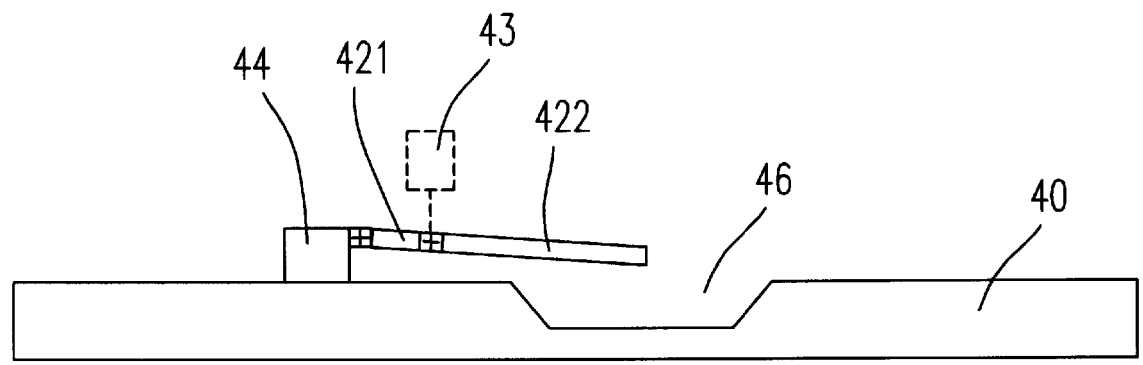
Figure 5:
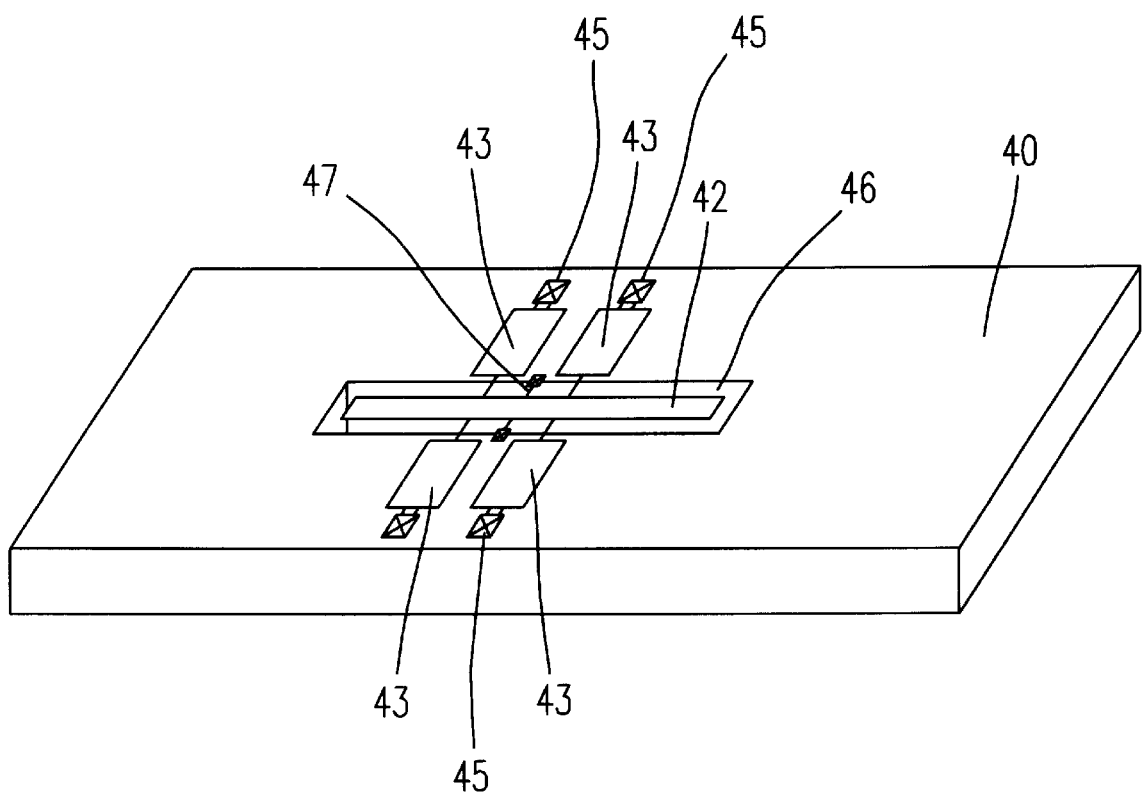
FIG. 5 is a schematic diagram showing a third embodiment of a micro-mechanical actuator according to the present invention.

FIG. 5 is a schematic diagram showing a second embodiment of a micro-mechanical actuator according to the present invention. The micro-mechanical actuator includes several elements similar to those of FIG. 4, which are labeled with the same numeral references. The micro-mechanical actuator in this embodiment, however, includes two sets of actuating force generators 43 which cooperate to rotate the auxiliary lever 42 about the fulcrum 47. This actuator allows two objects (not show) connected to two opposite ends of the auxiliary lever 42 to be actuated. Alternative, an object can be integrated with to rotate with the auxiliary lever 42 about the fulcrum 47.

Figure 6A:
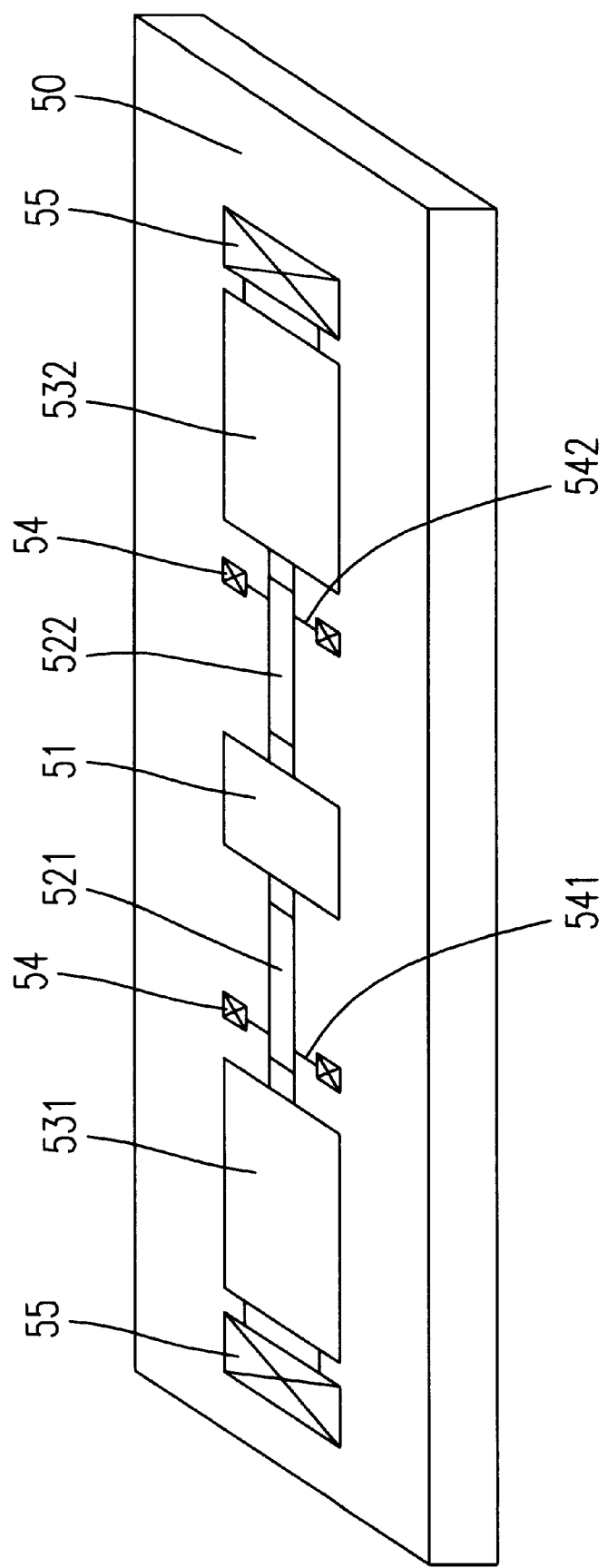
FIG. 6A is a schematic diagram showing a fourth embodiment of a micro-mechanical actuator according to the present invention.

Referring to FIGS. 6A~6C, a fourth embodiment of a micro-mechanical actuator according to the present invention includes a substrate 50, a first and second actuating force generators 531 and 532, a first and second auxiliary lever 521 and 522, anchors 54, 55 and first and second fulcrums 541 and 542, which perform similar functions as described above with reference to FIG. 3. Each of the actuating force generators 531 and 532 also includes a top electrode and a bottom electrode as mentioned above with reference to FIGS. 3B and 3C. According to this embodiment, the object 51 can be horizontally moved up and down, as shown in FIG. 6C.

Figure 7:
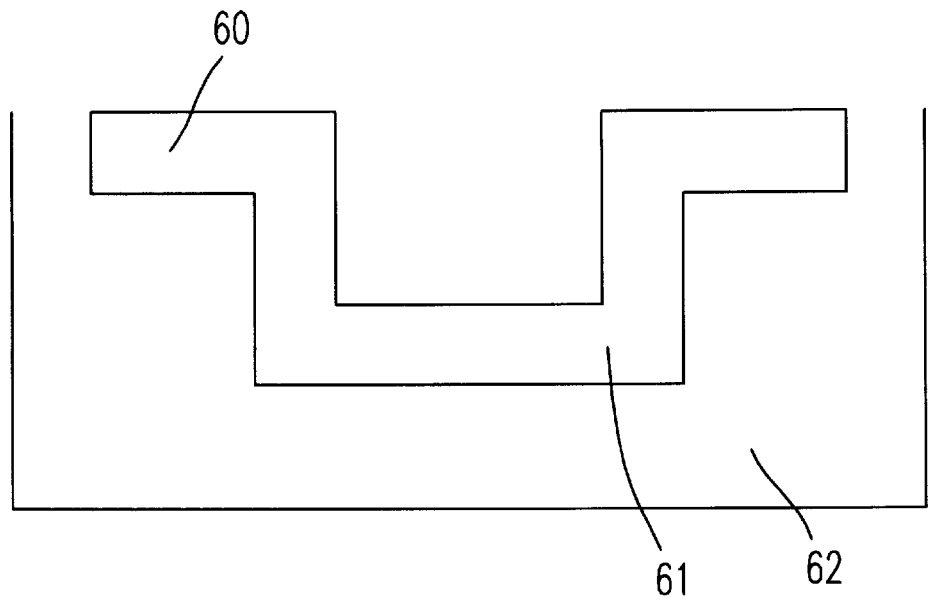
FIG. 7 is a schematic diagram showing a preferred embodiment of an auxiliary lever according to the present invention.

For any of the above embodiments, the auxiliary lever 60 preferably includes a bump structure 61 of a U-shape extending toward to the trench 62, as shown in FIG. 7, for strengthening the auxiliary lever 60 and preventing from distortion.

Figure 8:
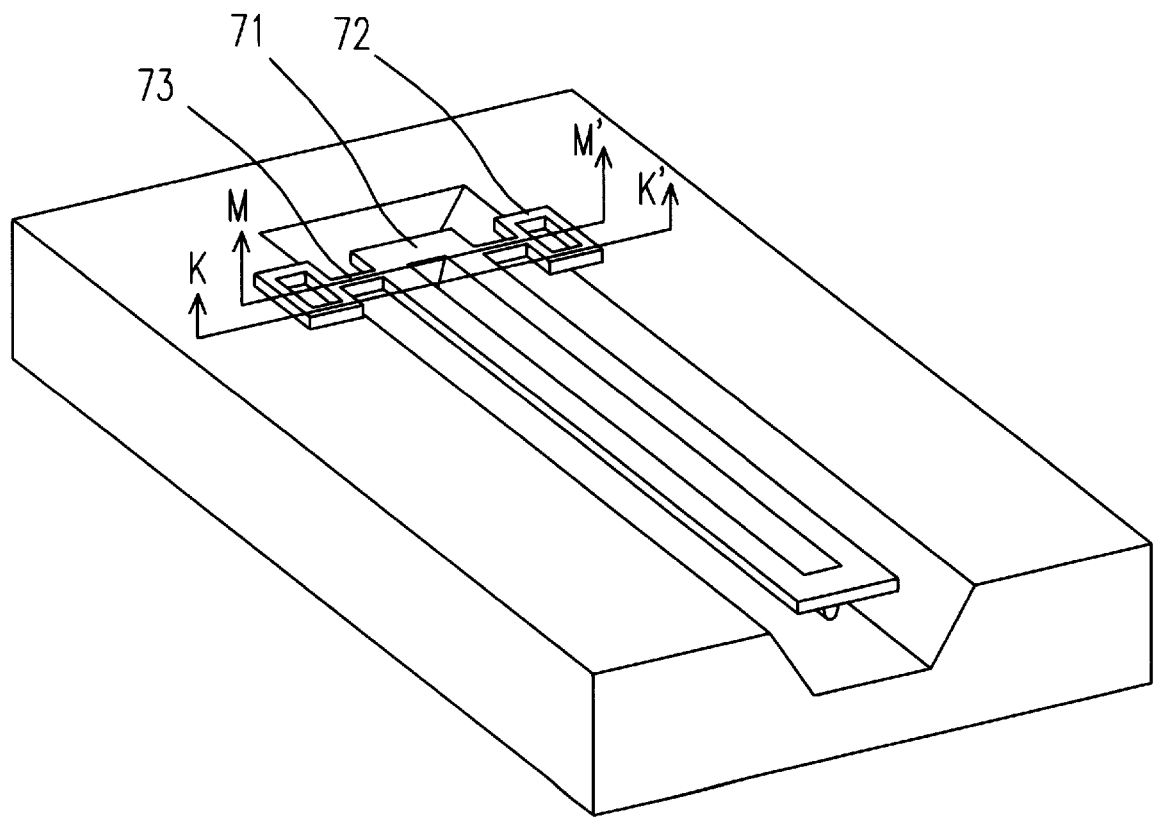
FIG. 8 is a schematic diagram showing a preferred embodiment of a structure consisting of an auxiliary lever, an fulcrum and anchors according to the present invention.

Further, the structures of the auxiliary lever 71, anchors 72 and fulcrum 73 therebetween, as shown in FIG. 8, can be produced by a technique analogous to a semiconductor manufacturing process, which will be described hereinafter.

Figure 9A:
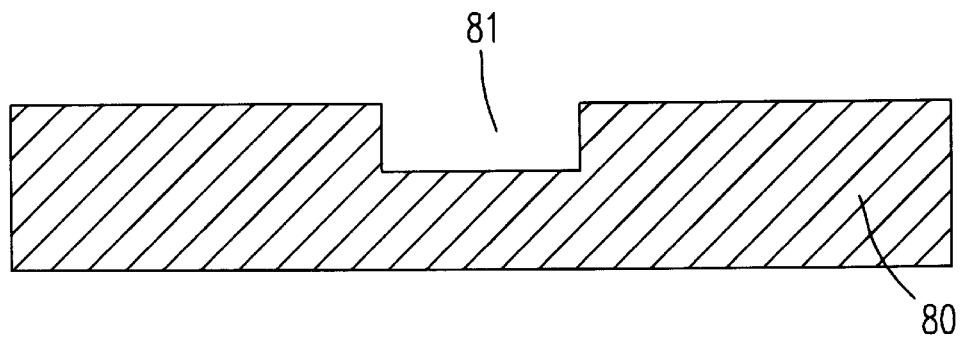
FIGS. 9A~9H are cross-sectional views of the structure of FIG. 8 schematically showing an embodiment of a manufacturing process thereof according to the present invention.
Figure 9B:
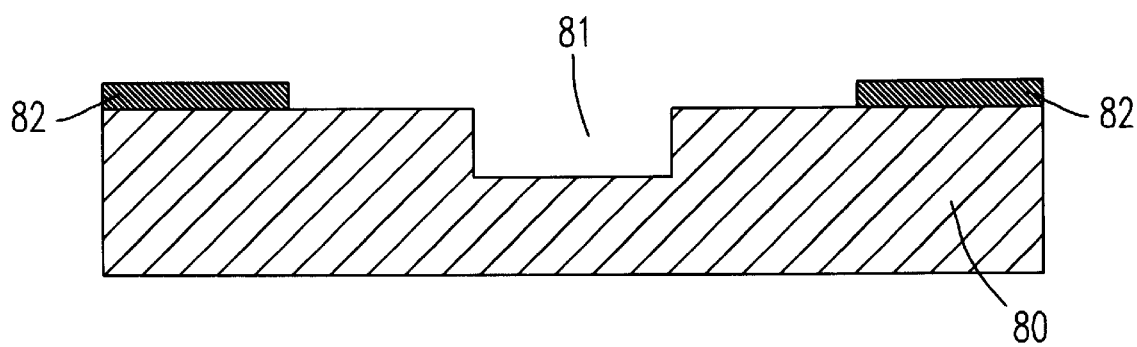
Figure 9C:
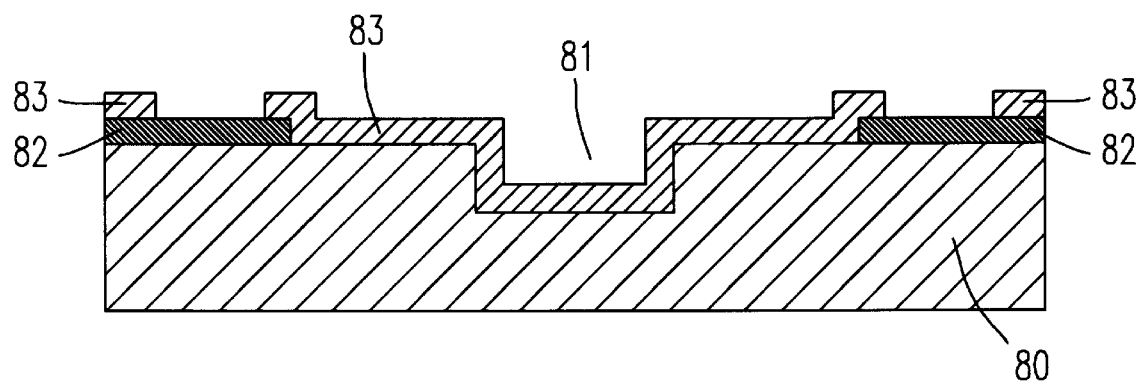
Figure 9D:
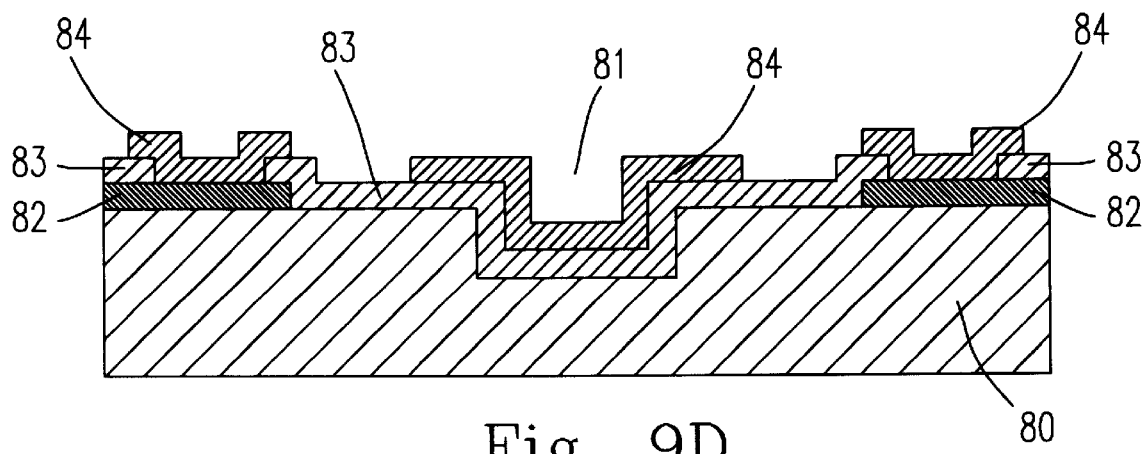
Figure 9E:
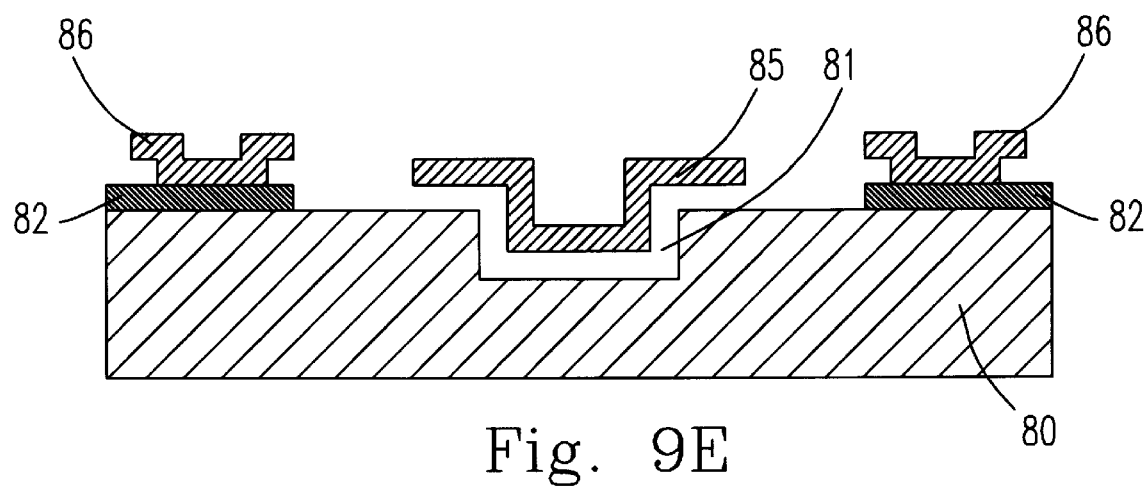
Figure 9F:
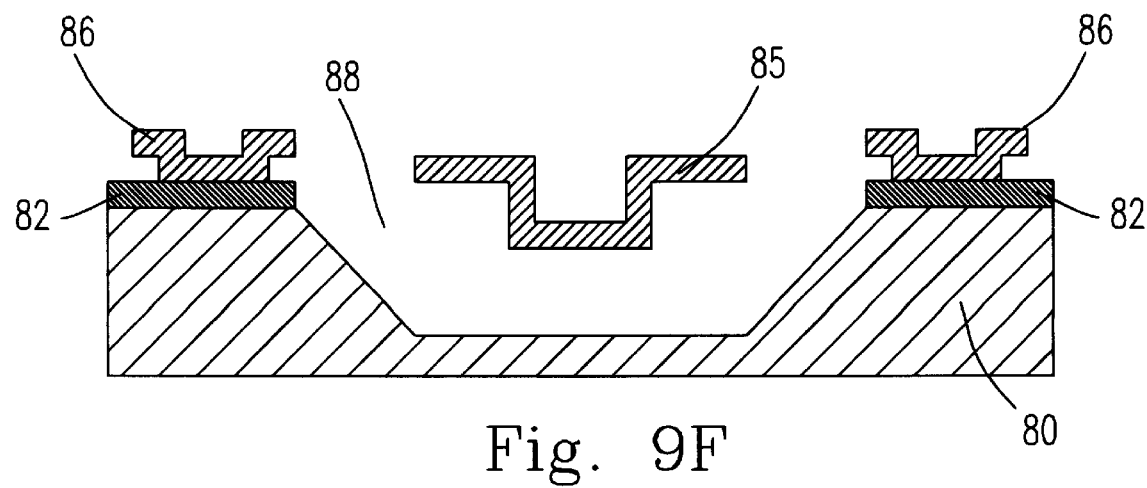
Figure 9G:
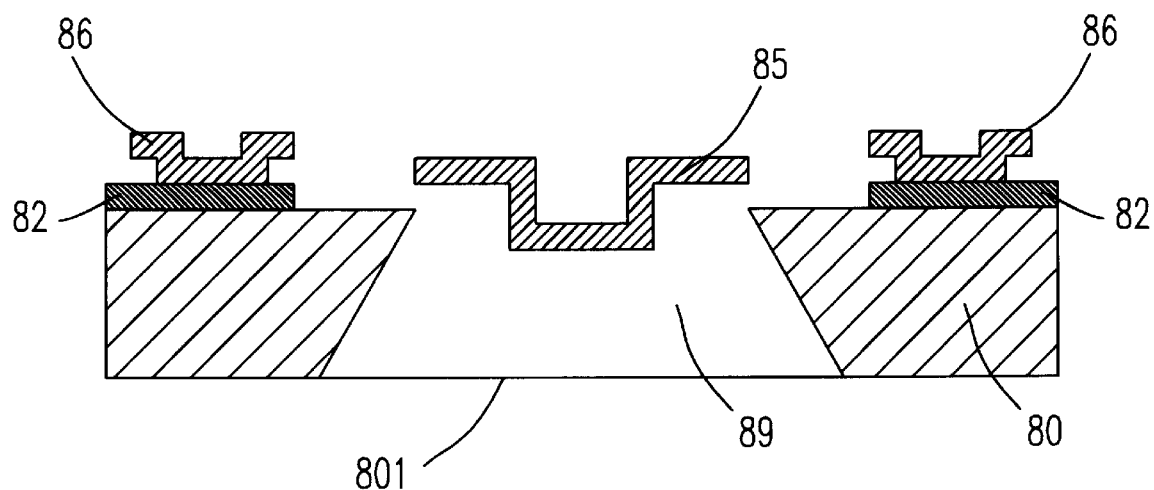
Figure 9H:
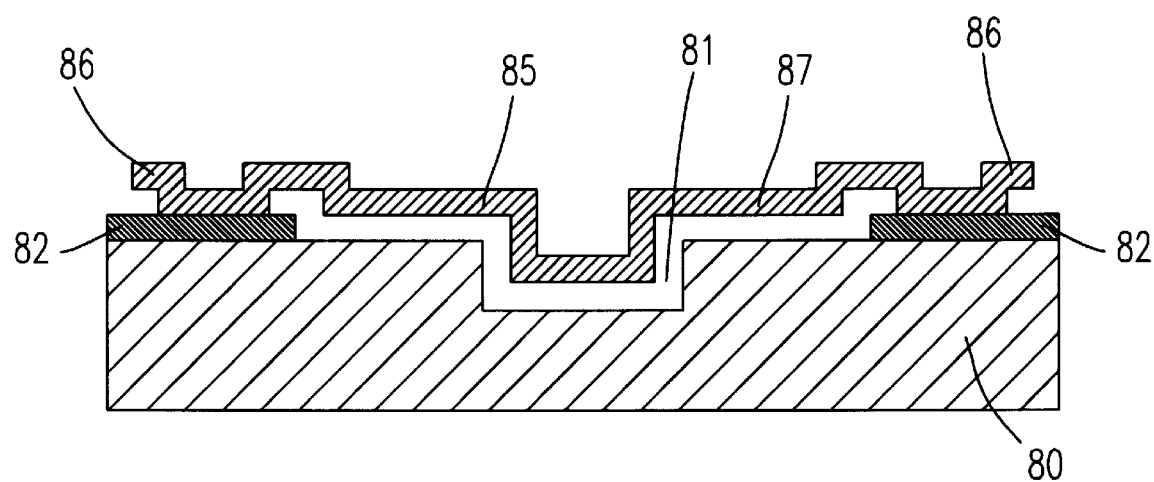

Please refer to FIGS. 9A~9G which are cross-sectional views taken along the line K–K' of FIG. 8, and FIG. 9H which is a cross-sectional view taken along the line M–M' of FIG. 8 for schematically showing a first embodiment of a manufacturing process for producing the structures of FIG. 8. A silicon substrate 80 is provided, and a trench 81 is formed thereon, as shown in FIG. 9A. A patterned mask layer 82 is then formed, as shown in FIG. 9B. On the resulting structure of FIG. 9B, a sacrificial layer 83 is formed and patterned, as shown in FIG. 9C. Next, a structure layer 84 is formed and patterned to remain a portion of the structure layer above the trench 81 and another portion above the mask 82, as shown in FIG. 9D. Then, the sacrificial layer 83 is removed to define the auxiliary lever 85, anchor 86 (FIG. 9E) and fulcrum 87 (FIG. 9H), and the substrate 80 at the trench portion 81 is further etched by anisotropic wet etching to create a space 88 for the movement of the auxiliary lever 85, as shown in FIG. 9F.

Alternatively, the substrate 80 can be etched by anisotropic wet etching from the back side 801 of the substrate 80 to create a space 89 for the movement of the auxiliary lever 85, as shown in FIG. 9G.

In the embodiment mentioned above, the substrate 80 is a silicon substrate. The mask 82 is formed of silicon nitride. The sacrificial layer 83 is formed of silicon dioxide. The structure layer 84 is formed of silicon nitride of low strain, polysilicon or metal.

Figure 10A:
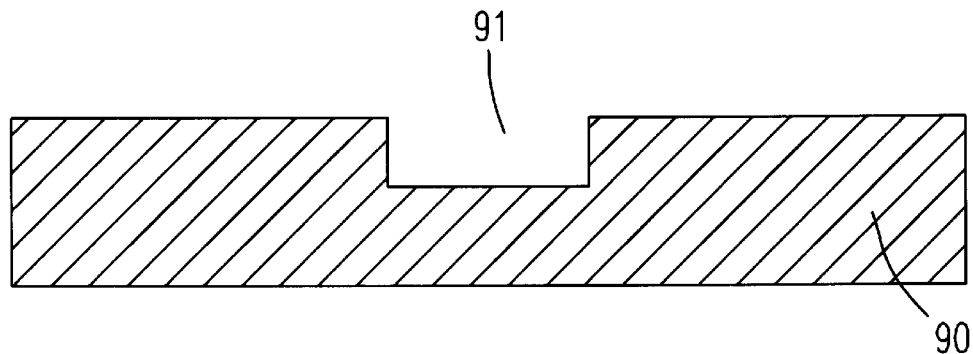
FIGS. 10A~10F are cross-sectional views of the structure of FIG. 8 schematically showing another embodiment of a manufacturing process thereof according to the present invention.
Figure 10B:
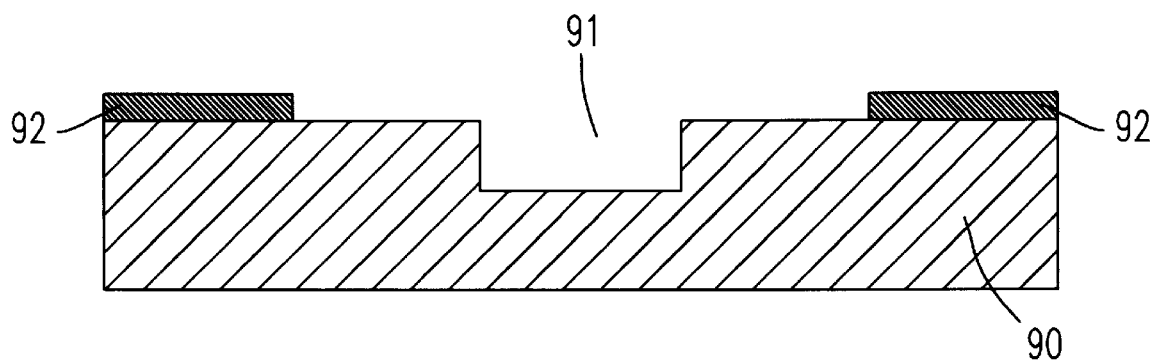
Figure 10C:
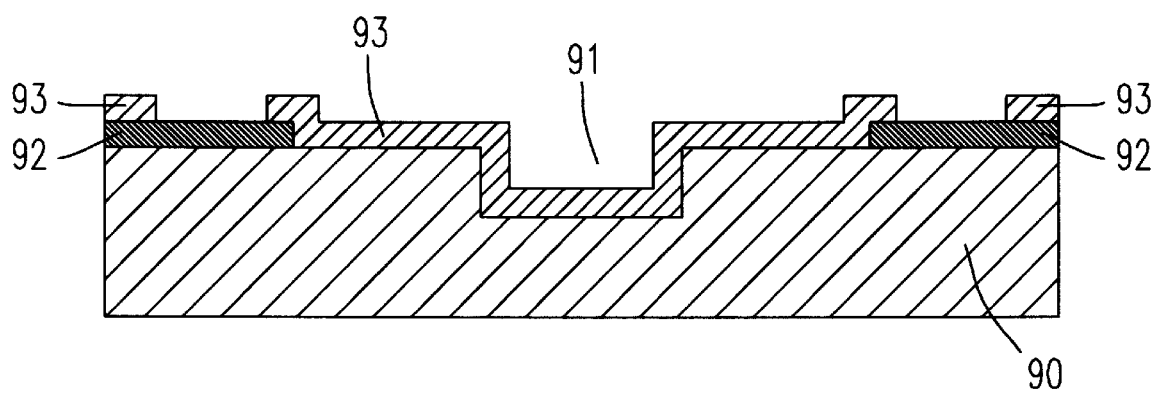
Figure 10D:
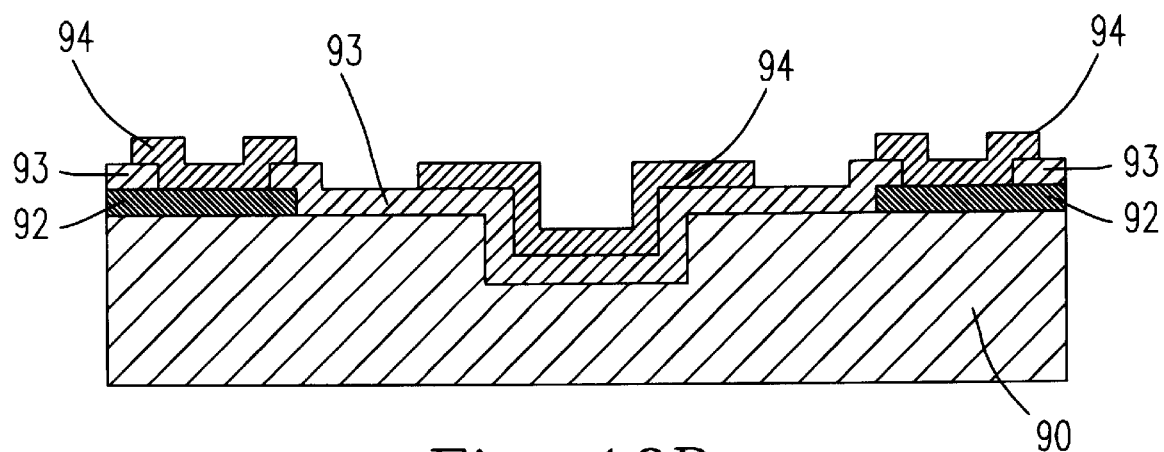
Figure 10E:
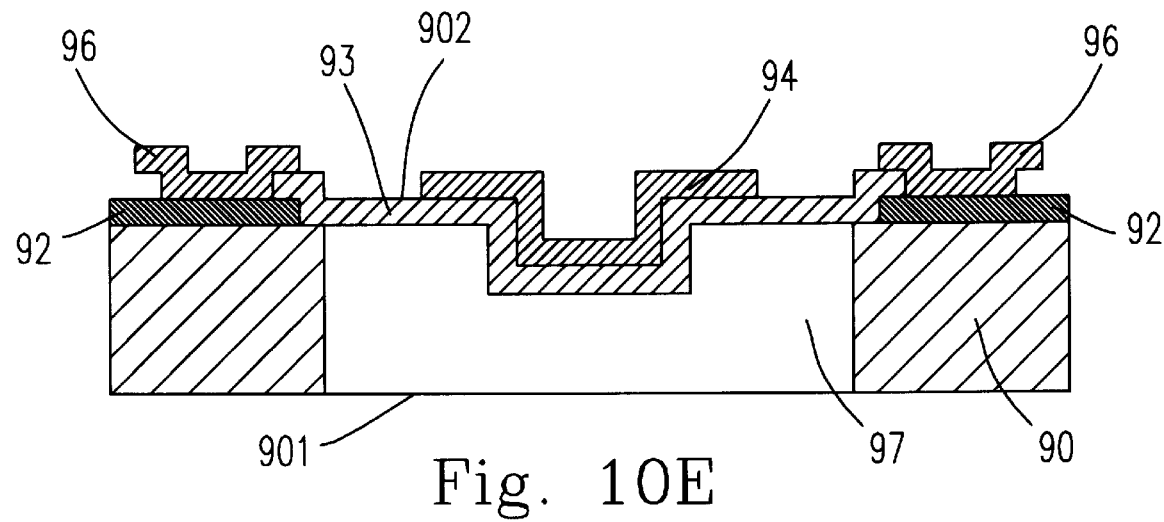
Figure 10F:
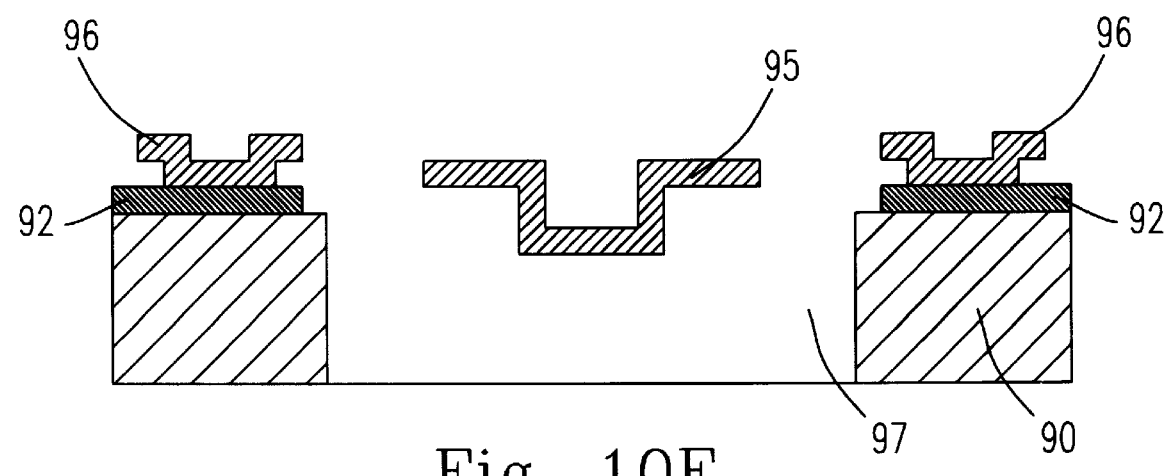

FIGS. 10A~10F schematically show a second embodiment of a manufacturing process for producing the structures of FIG. 8 wherein the numeral references 90, 91, 92, 93 and 94 in FIGS. 10A~10D respectively indicate the substrate, trench, mask, sacrificial layer and structure layer similar to those described in the first embodiment of manufacturing process, and can be formed in similar ways. Referring to FIG. 10E, the substrate 90 is then etched by deep reactive ion etching (RIE) from the back side 901 of the substrate 90 with the sacrificial layer 93 of the front side 902 as a shield, thereby enlarging the trench 91 to provide a space 97. Afterwards, the sacrificial layer 93 is removed to define the auxiliary lever 95, anchor 96 (FIG. 10F) and fulcrum (not shown). The presence of the space 97 allows the movement of the auxiliary lever 95 therein.

For the micro-mechanical actuator illustrated as above, by properly and optionally using various numbers and/or lengths of auxiliary levers, and properly locating fulcrums, the object can be rotated, or horizontally shifted upwards and/or downwards as desired. On the other hand, the actuated object can be moved in a relatively large travel range or rotated in a relatively large angle according to the present invention. Therefore, the present micro-mechanical actuator is suitable for use in a optical switch or radio-frequency (RF) switch in a micro-electro-mechanical system. Further, embodiments of manufacturing processes are provided to integrally form the auxiliary lever, fulcrum, and anchors of the micro-mechanical actuator.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A micro-mechanical actuator for actuating an object in a micro-electro-mechanical system, comprising:
   a substrate for being flexibly connected thereto said object;
   a first actuating force generator positioned on said substrate for generating a first actuating force;
   a first auxiliary lever having opposite first and second portions thereof flexibly connected to said first actuating force generator and a first end of said object, respectively, for performing a first levering operation to transmit said object in response to said first actuating force; and
   a first fulcrum element connected to said first auxiliary lever for allowing said first auxiliary lever to perform said first levering operation thereabout, and arranged at a first specific position for allowing said second portion of said first auxiliary lever has a first shift larger than a second shift of said first portion of said first auxiliary lever in response to said first actuating force.

2. The micro-mechanical actuator according to claim 1 wherein said first actuating force generator includes:
   a bottom electrode secured on said substrate; and
   a top electrode flexibly connected to said first auxiliary lever and said substrate, and moved downwards by an attracting electrostatic force between said top and bottom electrodes to generate said first actuating force for said first auxiliary lever.

3. The micro-mechanical actuator according to claim 1 wherein said first auxiliary lever includes a bump structure for strengthening said first auxiliary lever.

4. The micro-mechanical actuator according to claim 1 wherein said first fulcrum is secured onto said substrate via an anchor.

5. The micro-mechanical actuator according to claim 1 wherein said first specific position of said first fulcrum lies between said first and second portions of said first auxiliary lever.

6. The micro-mechanical actuator according to claim 1 wherein said specific position of said first fulcrum lies at the same side of said first and second portions.

7. The micro-mechanical actuator according to claim 1 wherein said substrate is directly connected thereto a second end of said object.

8. The micro-mechanical actuator according to claim 1 further comprising:
   a second actuating force generator positioned on said substrate for generating a second actuating force;
   a second auxiliary lever having opposite third and fourth portions thereof flexibly connected to said second actuating force generator and a second end of said object, respectively, for performing a second levering operation to transmit said object in response to said second actuating force; and
   a second fulcrum element connected to said second auxiliary lever for allowing said second auxiliary lever to perform said second levering operation thereabout, and arranged at a second specific position for allowing said fourth portion of said second auxiliary lever has a third shift larger than a fourth shift of said third portion of said second auxiliary lever in response to said second actuating force.

9. The micro-mechanical actuator according to claim 1 wherein said substrate includes a trench positioned right under said first actuating lever and said object for providing a space at least sufficient for said first and second shifts of said first actuating lever.

10. The micro-mechanical actuator according to claim 1 wherein said substrate is a silicon substrate.

11. The micro-mechanical actuator according to claim 1 for actuating an optical switch in a micro-electro-mechanical system.

12. The micro-mechanical actuator according to claim 1 for actuating a radio-frequency (RF) switch in a micro-electro-mechanical system.

13. The micro-mechanical actuator according to claim 1 wherein said first auxiliary lever and said first fulcrum are formed by steps of:
   forming a trench and a mask on said substrate;
   forming a sacrificial layer over said trench;
   forming a structure layer on said sacrificial layer and said mask; and
   defining a pattern on said structure layer, and removing said sacrificial layer.

14. The micro-mechanical actuator according to claim 13 wherein said substrate is a silicon substrate.

15. The micro-mechanical actuator according to claim 13 wherein said mask is formed of silicon nitride.

16. The micro-mechanical actuator according to claim 15 wherein said sacrificial layer is formed of silicon dioxide.

17. The micro-mechanical actuator according to claim 15 wherein said structure layer is formed of a material selected from a group consisting of silicon nitride, polysilicon and metal.

18. The micro-mechanical actuator according to claim 13 wherein said first auxiliary lever includes a U-shaped cross section extending toward said trench.

19. The micro-mechanical actuator according to claim 13 wherein said trench is further enlarged by etching said substrate.

20. The micro-mechanical actuator according to claim 19 wherein the etching of said substrate is performed by anisotropic wet etching after removing said sacrificial layer.

21. The micro-mechanical actuator according to claim 19 wherein the etching of said substrate is performed by deep reactive ion etching from a side of said substrate opposite to said sacrificial layer before removing said sacrificial layer.

22. The micro-mechanical actuator according to claim 13 wherein said pattern further includes an anchor on said mask for securing said first fulcrum onto said substrate.

\* \* \* \* \*